United States Patent [19]

Telfair et al.

[11] Patent Number: 4,916,319
[45] Date of Patent: Apr. 10, 1990

[54] BEAM INTENSITY PROFILOMETER

[75] Inventors: William B. Telfair, Newtown; Clifford A. Martin, Bridgeport; Paul R. Yoder, Wilton, all of Conn.; Eugene I. Gordon, Pacific Palisades, Calif.

[73] Assignee: Tauton Technologies, Inc., Monroe, Conn.

[21] Appl. No.: 185,152

[22] Filed: Apr. 22, 1988

[51] Int. Cl.⁴ .................................................. G01J 5/48
[52] U.S. Cl. ................................. 250/461.1; 250/365; 250/372
[58] Field of Search ...................... 250/372, 461.1, 365

[56] References Cited

U.S. PATENT DOCUMENTS

| | | | |
|---|---|---|---|
| 3,462,601 | 8/1969 | Sternglass | 250/336.1 |
| 3,549,886 | 12/1970 | Hilborn | 250/459.1 |
| 3,598,998 | 8/1971 | Becker et al. | 250/330 |
| 3,659,102 | 4/1972 | Toriyama | 250/458.1 |
| 3,680,965 | 8/1972 | Dilworth et al. | 356/235 |
| 3,838,282 | 9/1974 | Harris | 250/372 |
| 4,260,251 | 4/1981 | Conrad | 356/121 |
| 4,376,892 | 3/1983 | Charpak et al. | 250/372 |
| 4,490,039 | 12/1984 | Bruckler et al. | 356/121 |
| 4,602,272 | 7/1986 | Duschl | 358/10 |
| 4,670,646 | 6/1987 | Spivey | 250/201 |

FOREIGN PATENT DOCUMENTS

| | | | |
|---|---|---|---|
| 338978 | 7/1959 | Switzerland | 250/461.1 |
| 2200987 | 8/1988 | United Kingdom | 250/365 |

OTHER PUBLICATIONS

J. M. Robertson et al., "Cathodoluminescent Garnet Layers", *Thin Solid Films*, 114, (1984), pp. 221-240.
G. Edwards, "Choosing and Using Laser-Beam-Profile Monitors", *Laser Focus/Electro-Optics*, (May, 1987), pp. 76-84.
R. L. Rypma, "Laser Beam Profiling The Automated Way", *Photonics Spectra*, (Aug. 1987), pp. 67-74.
Telfair et al., "Characterization of UV Laser Beams Using Fluorescence", SPIE (Jan. 15, 1988).

*Primary Examiner*—Constantine Hannaher
*Attorney, Agent, or Firm*—Kramer, Brufsky & Cifelli

[57] ABSTRACT

A beam intensity profilometer produces a fluorescent emission distribution having a spatial distribution linearly proportional to the local intensity of an incident UV beam shined into the profilometer. The spatial distribution of the UV beam is analyzed and displayed as a function of the fluorescent emission.

17 Claims, 4 Drawing Sheets

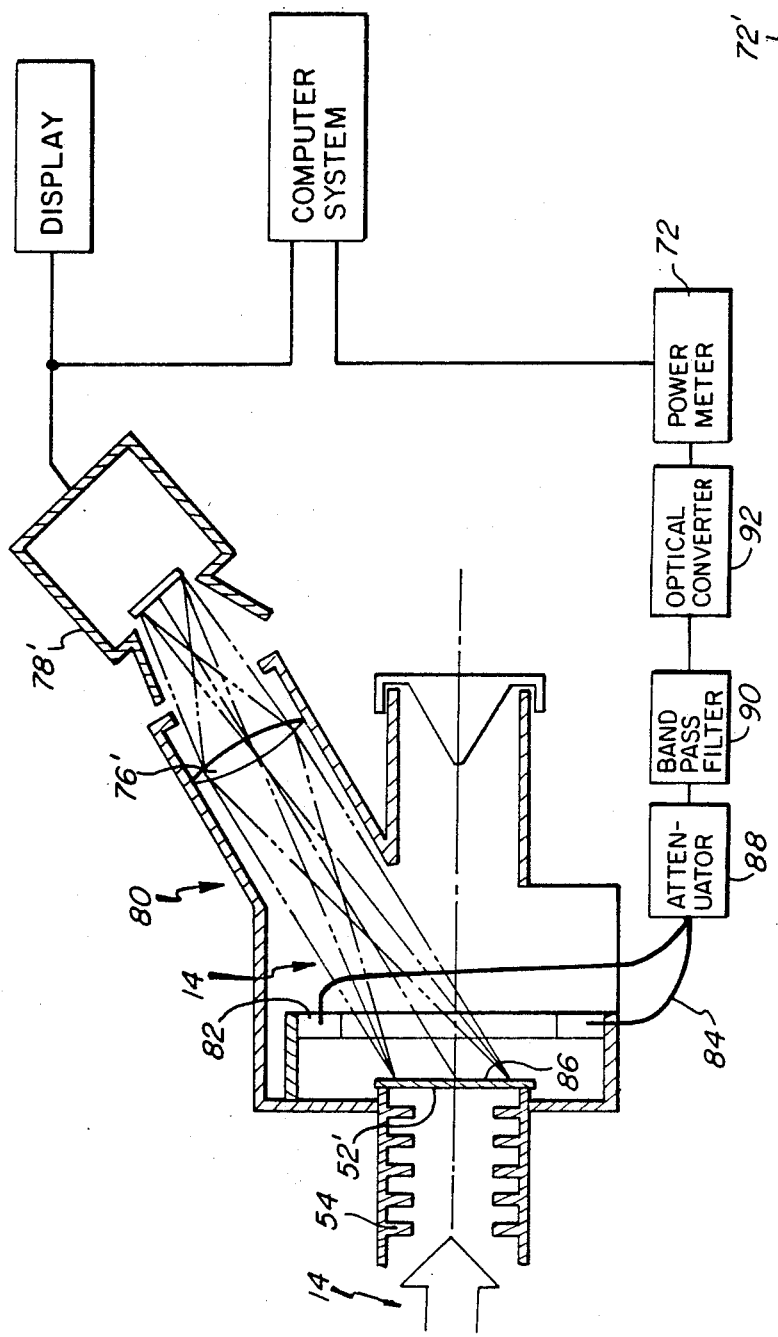
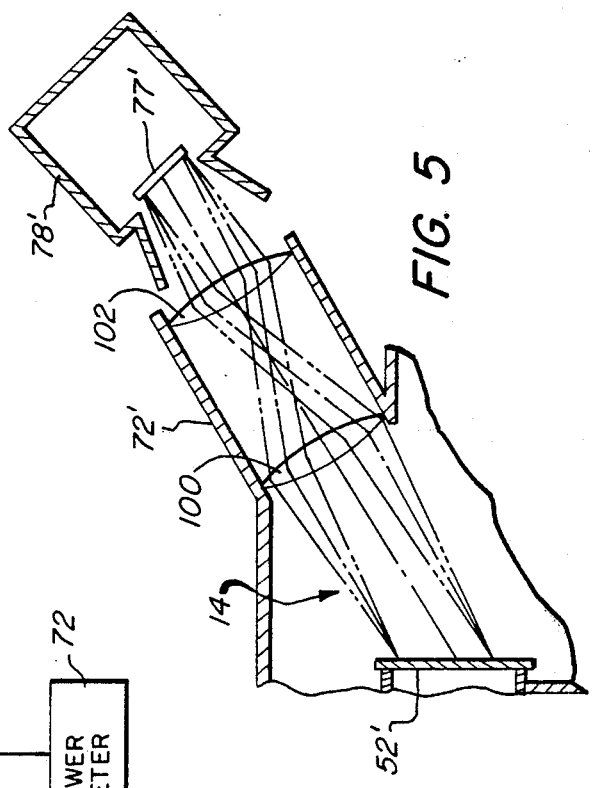
FIG. 4
FIG. 5

BEAM INTENSITY PROFILOMETER

BACKGROUND OF THE INVENTION

This application relates to U.S. patent application Ser. No. 185,867, entitled "Ultraviolet Radiometer" by Telfair et al., filed Apr. 22, 1988.

While the subject invention is subject to a wide range of applications, it is particularly suited to display and analyze the two-dimensional intensity distribution across an ultraviolet (UV) laser beam. In particular, applications relating to beam viewing, near real-time intensity profilometry and quantitative diagnosis of laser beam quality are set forth.

As high fluence UV lasers move from the research laboratories into medical and industrial applications, there is an increasing need for better, more reliable diagnostic equipment to handle the high fluence and energetic photons. Better intensity uniformity and more repeatable pulse-to-pulse energy is demanded by such applications as photolithography and etching in the manufacture of semi-conductors, tissue ablation in opthalmology and angioplasty, and even routine material processing such as cutting and drilling. To develop these and other technologies, a more accurate masurement method is needed.

The conventional measurement techniques for intensity profile of laser radiation have been found to be inadequate for certain high power laser applications. Scanning systems using a wire, pinhole or slit (knife edge) are inadequate to measure intra pulse parameters. They are only usable with continuous lasers or for averaging high repetition rate pulsing systems. Linear arrays give only one line of data from each pulse. Two dimensional array camera systems with good resolution are the most useful for collecting data about intensity profiles, and they work well at the longer wavelengths.

When these technologies are applied to the high fluence, short pulse, UV excimer lasers, the energetic photons break chemical and atomic bonds and eject material by ablation at supersonic speeds. Hence, much of the energy is converted into chemical and translational energy and may be lost to the detection mechanism. In addition, the photons can be directly destructive to the detection system and cause it to change and/or shorten its lifetime.

By far, the most common technique for looking at laser beam shape and intensity structure is "burn" paper. One can expose a single pulse and get a two dimensional pattern. This pattern is really a single level threshold slice of the actual intensity profile. With papers of differing sensitivity, a multi-level slice profile of a laser beam (assuming the pulses are repeatable in shape and energy) can be constructed. These "burn" papers are, by their nature, very non-linear and even large intra pulse intensity variations in addition to the inter pulse variations can be missed.

A number of patents are directed to measuring the wavefront of a laser. These include U.S. Pat. Nos. 3,462,601; 3,549,886; 3,598,998; 3,680,965; 4,260,251; 4,376,892; 4,490,039; 4,602,272; and 4,670,646. However, none of these patents disclose the use of a plate of UV activated fluorescent material as with the present invention.

A description of various prior art systems was disclosed in a paper entitled "Characterization of UV Laser Beams Using Fluorescence", by Telfair et al., delivered at the Society of Photo-Optical Instrumentation Engineers (SPIE) on Jan. 15, 1988 in Los Angeles, Calif. and in articles entitled "Choosing And Using Laser-Beam-Profile Monitors", by Edwards, in *Laser Focus/Electro-Optics*, May, 1987, pgs. 76–84 and "Laser Beam Profiling The Automated Way", by Rypma, *Photonics Sprectra*, August, 1987, pgs. 67–74.

A material which has been found to be particularly useful in converting invisible UV radiation to visible fluorescent radiation is a rare earth doped garnet, $Ce^{3+}$: $Y_3Al_5O_{12}$ (YAG). The ability of this material to fluoresce is described in an article entitled "CATHODOLUMINESCENT GARNET LAYERS", by J. M. Robertson, *Thin Solid Films*, 114 (1984) 221–240. The article, however, does not disclose the concept of measuring a high powered UV laser beam with an instrument incorporating the doped YAG material.

It is a problem relating to the present invention to provide an effective means for displaying and analyzing the intensity distribution across a high power, UV laser beam.

It is an advantage of the present invention to provide a beam intensity profilometer which obviates one or more of the limitations and disadvantages of the described prior arrangements.

It is a further advantage of the present invention to provide a beam intensity profilometer which displays and analyzes the intensity distribution across UV laser beams.

It is a still further advantage of the present invention to provide a beam intensity profilometer which analyzes the intensity distribution across UV laser beams in near real-time.

It is a yet further advantage of the present invention to provide a beam intensity profilometer which measures the total power and energy of a laser beam in addition to displaying the intensity distribution.

It is a still another advantage of the present invention to provide a beam intensity profilometer which is relatively inexpensive to manufacture and operate.

Accordingly, there has been provided a beam intensity profilometer which includes a component to produce a fluorescent emission distribution having a spatial distribution linearly proportional to the local inensity of an incident UV beam aimed on the fluorescent emission distribution component. Devices for observing and analyzing the spatial distribution of the fluorescence are operatively connected to the fluorescent emission distribution component. In a second embodiment, an instrument for both analyzing the spatial distribution of the UV beam as well as the power and energy of the UV beam is provided.

Other embodiments are disclosed incorporating mirrors for reflecting the fluorescent emission distribution component to the photosensitive surface of a camera.

The invention and further developments of the invention are now elucidated by means of preferred embodiments shown in the drawings.

BRIEF DESCRIPTION OF THE DRAWINGS

FIG. 4 is a fourth embodiment of the present invention schematically illustrating an absolute intensity profilometer;

FIG. 5 is a fifth embodiment of the present invention schematically illustrating an alternate optical configuration;

DETAILED DESCRIPTION OF THE PREFERRED EMBODIMENT

Figure 1:
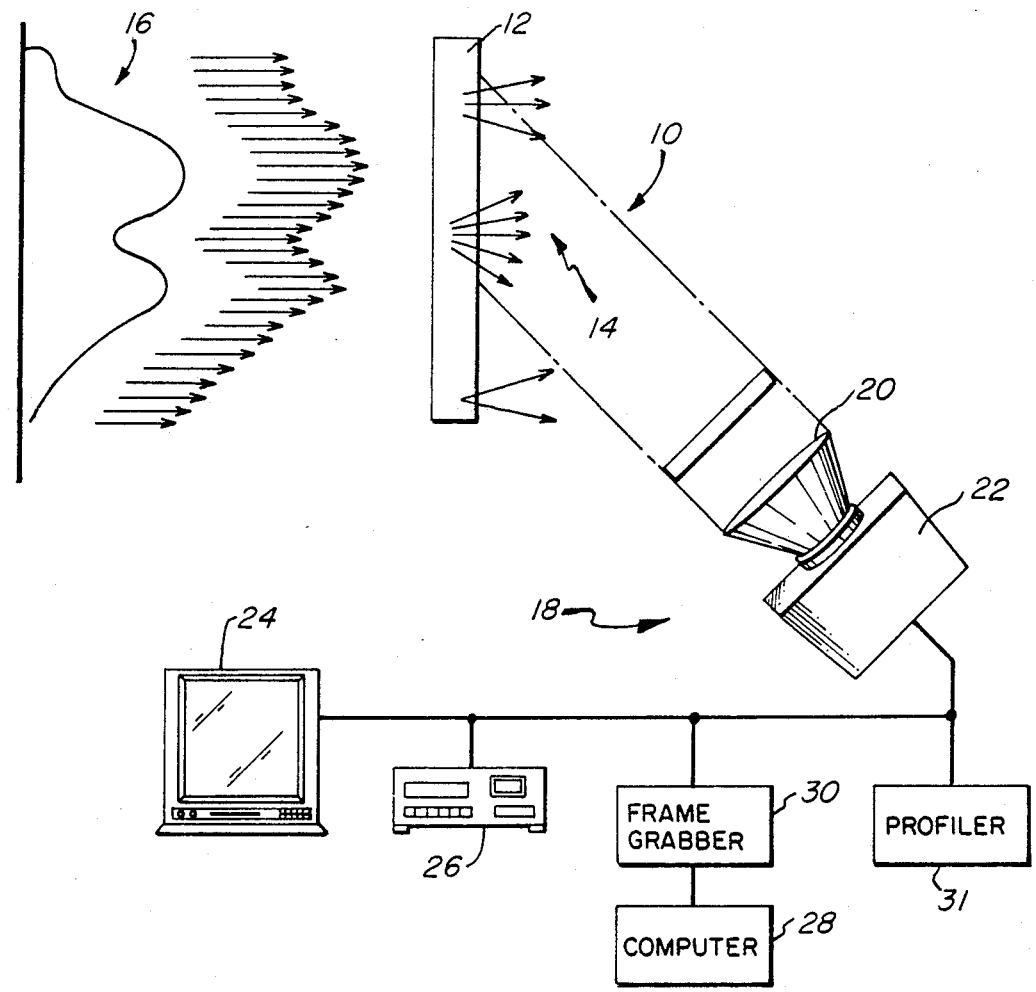
FIG. 1 is a schematic illustration of a beam intensity profilometer in accordance with the present invention.

A beam intensity profilometer 10, as illustrated in FIG. 1, includes an element 12 to produce a fluorescent emission distribution 14 having a spatial distribution substantially linearly proportional to the local intensity of an incident ultraviolet beam 16 intercepted by the fluorescent emission distribution element 12. A system 18 is operatively connected to the fluorescent emission distribution element 12 for displaying and analyzing the spatial distribution of the UV beam in response to the spatial distribution of the fluorescence.

Referring to FIG. 1, there is illustrated a beam intensity profilometer 10. The beam intensity profilometer 10 includes a fluorescent screen or plate 12 and a component 18 which enables the observation of the emitted fluorescence with a lens 20 or the unaided eye (not shown). The screen or plate 12 emits a fluorescent emission distribution 14 whose intensity is substantially linearly proportional to the intensity profile of the high powered, incident UV beam 16.

The selection of the material to construct screen or plate 12 is a critical aspect of the present invention. Although many optical materials fluoresce, the material used in the beam intensity profilometer preferably has a high damage threshold. A high damage threshold is particularly important for withstanding the power intensity of high energy UV lasers.

The instrument, herein identified as the beam intensity profilometer 10, is based on the principle that the fluorescent emission of certain materials used in constructing plate 12 is linearly proportional to the incident UV radiance over many orders of magnitude. The fluorescing atoms in the plate 12 absorb the incident UV radiation and are raised to an excited energy state. A very short time later these excited atoms decay, producing among other things, fluorescent emission. The fluorescent emission can be collected and converted to an electrical signal, which when calibrated, correlates to the UV beam. An observer can now "see" the UV radiation beam and determine the energy or power of the beam for a given period of time. The units for energy are joules and those for power are joules per second.

The plate 12 is constructed from a class of materials which are optically transparent to fluorescent wavelengths. For the purposes of the present invention, an optically transparent material is defined as one which transmits a sufficient amount of the fluorescence through the material to produce a usable optical signal, i.e. a signal which can be measured by a photodetector. This is a critical characteristic because the fluorescent radiation, resulting from the incidence of UV on the plate 12, must be emitted from the plate to ascertain the amount of emitted fluorescent radiation. Plate 12 is preferably opaque to UV radiation. However, the UV radiation from a laser beam, will typically be partially transmitted through the plate.

Other important characteristics of the plate 12 include the ability to withstand high fluence, i.e. the energy density of the UV laser incident on the plate, which is also indicative of a high damage threshold. The plate preferably has a high signal to noise ratio, i.e. a good conversion efficiency. That is, for a given amount of UV radiation incident on the plate, a high amount of fluorescent radiation is emitted. In the case of a $Ce^{3+}$: YAG plate being excited by an excimer laser, an approximate 25% conversion efficiency is achieved at 193 nm. Another important characteristic is a high spatial resolution which means that the fluorescent image closely reflects the UV radiation intensity pattern incident on the plate. Moreover, it is important that the amount of fluorescence for a given amount of UV radiation is very repeatable.

The fluorescing screen or plate 12 is constructed of a fluorescent material selected from the group consisting essentially of rare earth doped glasses, fluorescent mediums suspended in plastic, undoped crystals (e.g. sapphire) and rare earth doped crystals. Preferably, the material is a fluorescent crystalline material because these have higher damage thresholds.

In the preferred embodiment, the fluorescent material is a rare earth doped crystal such as a rare earth doped garnet like $Ce^{3+}$: $Y_3Al_5O_{12}$ (YAG). Besides cerium (Ce), other rare earth elements suitable for doping include neodymium (Nd), lanthanum (La) and Europium (Eu). However, it is within the terms of the present invention to dope the crystal with any suitable rare earth.

The fluorescent material can also comprise rare earth doped glasses. The glass could consist of any class of glasses, such as borosilicate glass, doped with any of the rare earth materials including Ce, Nd, Eu and La.

The fluorescent material can also be suspended in plastic. For example, a rare earth doped crystal, a rare earth doped glass or an undoped crystal could be pulverized and suspended in a plastic. Also, a plastic can be modified by either doping or chemically adding a dye or a rare earth element.

Referring again to FIG. 1, there is illustrated a laser beam 16 with a profile indicating a non-uniform intensity across the beam. Beam 16 is aimed onto a plate 12 which fluoresces, as indicated by 14. To observe the fluorescence, a TV camera 22 with a lens 20 or even the unaided eye is pointed towards the emitted fluorescence. The screen or plate 12 converts the intensity profile of the incident UV beam 16 linearly into the same intensity profile of the fluorescence 14. The composition of the fluorescent screen or plate 12 is in accordance with the principles set forth hereinbefore. For example, the material can be a $Ce^{3+}$: YAG which has proved to be effective in this application.

By selecting fluorescent materials having short time constants for plate 12, the beam intensity profilometer can record intensity distributions on a pulse-by-pulse basis. These records can be critical in diagnosing transient effects, which, for example, can produce hot spots that produce local damage sites in optical elements or beam relay systems. The instrument is also extremely useful in evaluating the uniformity of the beam energy distributions on a pulse-by-pulse basis.

The camera 22 is a component of system 18 which enables many beam diagnostics to be performed. These include the visual display of the intensity profile of any UV laser beam on a video monitor 24. A permanent recording of the temporal and spatial profile of the beam can also be accomplished by recording the electrical impulse corresponding to the optical signal relating to the fluorescence 14 beam on a video cassette recorder (VCR) 26. Not only can the UV beam be examined in a real time, but with a VCR, the beam can be archived, played back, slow played and even freeze framed for a complete analysis.

A computer 28 can be connected to the camera 22 for any number of beam analyses and diagnostics both in real time and off line. Depending on the software, these analyses include single pulse beam shape analysis and recognition; single pulse beam profile analysis and recognition; single pulse beam uniformity analysis and recognition, including average and standard deviation; multiple pulse average and standard deviation of the shape, profile and uniformity; and pulse stream outlyers or missing pulses. A conventional frame grabber 30 is preferably connected between the camera 22 and the computer 28 in order to accomplish these analyses. The frame grabber digitizes the camera image for delivery to the computer.

An on line profiler 31 is directly connected to the camera 22 for printing out the profile of the UV laser beam as it is being recorded.

Figure 2:
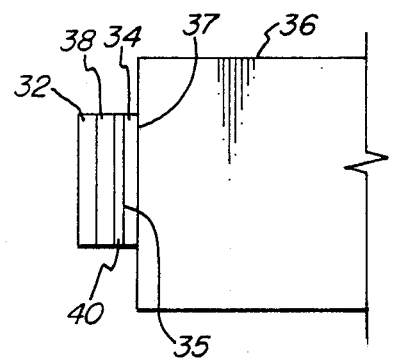
FIG. 2 is a schematic illustration of a second embodiment of the present invention comprising a compact version of the beam intensity profilometer.

Referring to FIG. 2, there is illustrated a second embodiment of the present invention wherein a fluorescent screen 32, positioned in front of the face plate 34 of a camera 36, enables the beam intensity profilometer instrument to be a more compact, versatile system. The screen 32 is essentially the same as screen 12 in the embodiment illustrated in FIG. 1. Since UV radiation can damage the camera face plate, and the fluorescent screen 32 does not completely absorb the UV radiation aimed onto it, a fluorescence transmitting and UV blocking filter coating 38 can be placed between the screen 32 and the camera face plate 34. In addition, it may be necessary to place a second filter coating 40 between the fluorescent screen 32 and the face plate to absorb fluorescence produced in the first filter 38. The camera illustrated in FIG. 2, can be substituted for the camera 22 and plate 12 of the embodiment illustrated in FIG. 1 enabling many beam diagnostics to be performed including: (1) the visual display of the intensity profile of any UV laser beams; (2) a permanent recording of the temporal and spatial profile of the beam; (3) displaying line-by-line beam cross sections; and (4) the permanent recording of the intensity profile of any UV laser beam with a camera. This camera includes a fiber optic face plate 34 to enable the intensity distribution on the input face 35 to be transferred directly to the output face 37 thereof.

Figure 3:
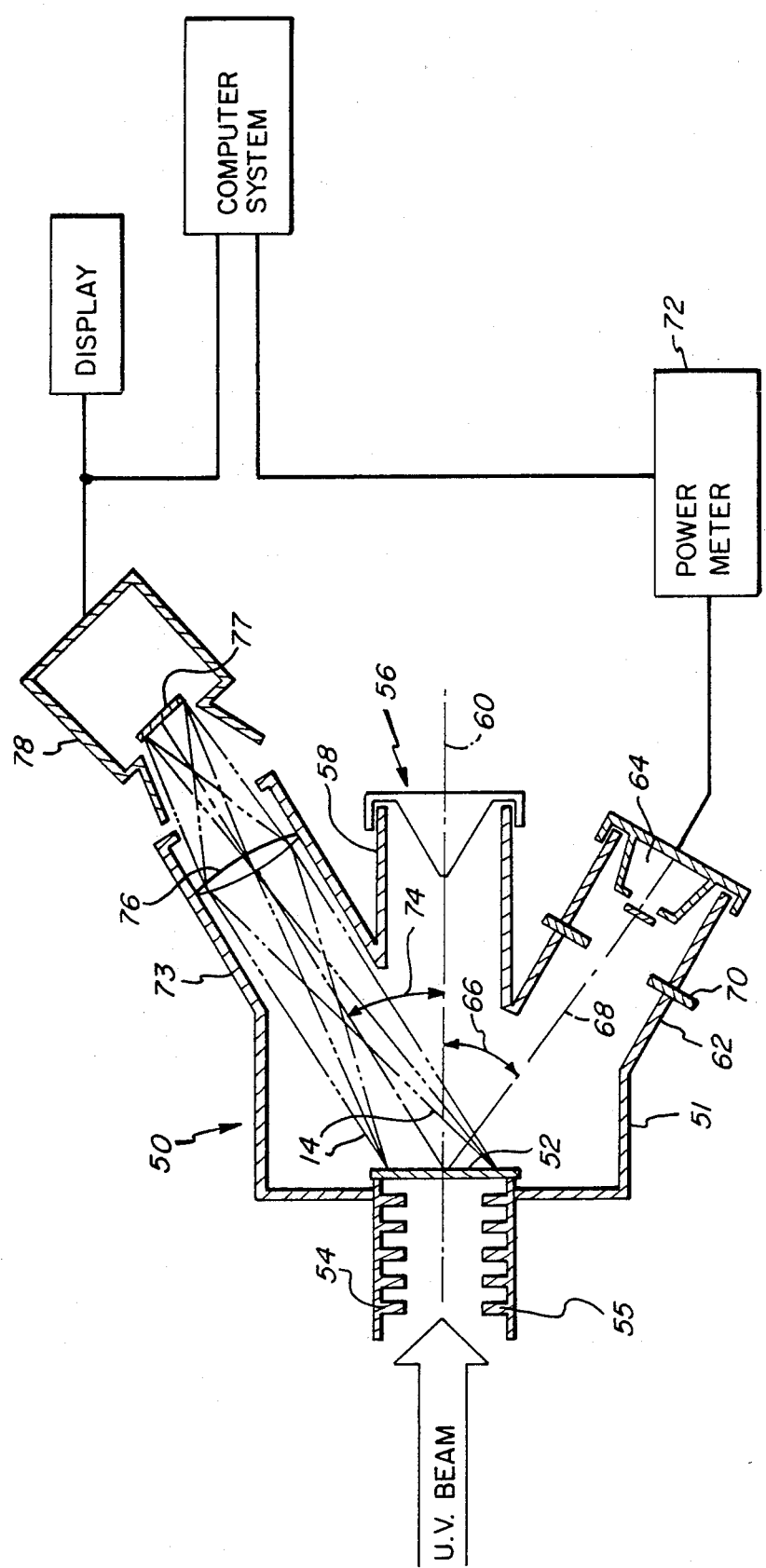
FIG. 3 is a third embodiment of the present invention schematically illustrating an absolute intensity profilometer.

Referring to FIG. 3, there is illustrated an absolute intensity profilometer 50. The device 50 can both calibrate the total energy and power of a UV laser beam as well as display its spatial profile and mode structure.

Instrument housing 51 is a light tight enclosure which incorporates a fluorescing plate 52. The latter plate is constructed of the same class of materials as with plate 12 described hereinbefore. A conventional light baffle 54 extends outwardly from the housing 51 and supports fluorescent plate 52 at one end by any conventional means. The internal diameter of the baffle establishes the maximum aperture size through which UV radiation can enter the housing 51. The baffle 54 prevents stray light around the instrument from impinging on plate 52. The inner surface of the baffle 54 can be provided with ribs or grooves 55 to reduce reflection within the baffle. A UV light trap 56 is provided on a tube 58 which extends longitudinally with an axis 60 through enclosure 51. The trap 56 is provided to suppress the UV beam transmitted through plate 52. It is also within the scope of the present invention to substitute a mirror type element for the light trap 56 and cause the UV beam to be reflected back onto the plate 52.

A second tube 62 extends from the enclosure 51. The tube 62 is provided with conventional photodetector 64 at one end to collect fluorescing light emanating from the plate 52. For example, a National Bureau of Standards traceable photodetector such as an LR-7000 Laser Radiometer from E. G. and G Gamma Scientific of San Diego, Calif., is suitable. The detector 64 generates an electrical signal corresponding to the magnitude of the optical signal generated by the collected fluorescing light. The angle 66, between the centerline 60 through enclosure 51 and the centerline 68 through the tube 62 is preferably as small as possible in order to reduce the overall size of housing 51. However, it is also important to position the detector 64 as close as possible to the plate 52 in order that it can be exposed to enough light energy emanating from plate 52. Therefore, these factors are balanced in determining the angle 66. The tube 62 also includes a stop 70 to limit the field of view of the photodetector to the plate 52.

A power meter 72 is connected to the photodetector 64 to indicate the absolute power intensity of a UV beam focused onto plate 52. The power meter can display the intensity in a digital and/or an analog format. A system incorporating this general idea is described in U.S. application Ser. No. 185,867 to Telfair et al., described hereinbefore, which is incorporated by reference within this specification.

A second tube 73 extends at an angle 74 with the axis 60 and provides a light path whereby fluorescence from plate 52 is focused through a single lens 76 into a camera system 78 of the type described and illustrated in FIG. 1 hereinbefore. Although a single lens is illustrated, it is within the terms of the present invention to substitute a group of multiple lenses for the single lens. Also, a single mirror or multiple mirrors can be substituted for lens 76 in FIG. 1, as is conventionally known in the optical design art.

Although the camera system embodiment illustrated in FIG. 1 can provide acceptable results, this design has two problems due to the off-axis viewing angle of the camera: (1) "keystone" distortion and (2) poor focus. To have the entire plate 52 in focus and to correct for "keystone" distortion, the angles of the plate 52, lens 76, and camera photosensitive surface 77 are arranged in accordance with the "Scheimpflug Principle". Residual problems are a small loss in spatial resolution dependent upon the off-axis angle and variations of image scale, illumination level and angle of incidence across the image. For a 10 degree off-axis viewing angle and a 0.5 mm thick plate, there is a 5.8 degree off-axis angle for the plate and a 51 micron resolution size. Thinner plates and smaller angles give better resolution.

Improvement of the system can be achieved by using multiple (typically two) lenses or lens groups to image the plate into the photosensitive surface 77' of the camera. The design is still in accordance with the Scheimpflug Principle as illustrated by FIG. 5. Specifically, the improvement lies in the positioning of the multiple lenses 100 and 102, the plate 52 and camera 78 with respect to the axis of the optical system extending through the tube 72'. The positioning of the plate 52', lenses 100, 102, and camera 78', in accordance with the Scheimpflug Principle, is used in photography and visual simulators to produce sharp imagery of an inclined object. Primed and double primed reference numerals indicate elements which are essentially the same as elements having the same unprimed reference numeral. The first order optical theory of the Scheimpflug system is explained by Kingslake in his book *Lenses In Photography*, Garden City Books, 1951, page 92. The improvement of using multiple lenses is described by Wetherell in the book *Applied Optics and Optical Engineering*, Vol. X, 1987, pgs. 178–180. This latter principle, when applied to the present invention, will result in the substantial elimination of poor focus, distortion variations of illumination level and of incidence angle of the intensity profile image. Although two lenses 100 and 102 are illustrated, it is within the terms of the present invention to substitute a multiplicity of groups of lenses or a plurality of mirrors.

Referring to FIG. 4, there is illustrated an absolute intensity profilometer 80 which is a modified version of the embodiment illustrated in FIG. 3 in which a ring 82, supporting a plurality of fiber optic strands 84, is disposed facing the rear surface 86 of plate 52'.

The ring 82 can support any number of optical fibers in order to collect a uniform distribution of the fluorescent light emitted from surface 86. Moreover, the angular position of the fiber ends are preferably positioned to give a uniform response from any location on surface 86.

The fibers 84 can be connected to an attenuator 88 and/or a band pass filter 90 as described in U.S. Patent Application Ser. No. 185,867, to Telfair et al., set forth hereinbefore. The fibers 84 can then be attached to a conventional electrical to optical converter 92. The electrical signal from the converter 92 can then be transmitted to a meter 72 as described hereinbefore.

Figure 6:
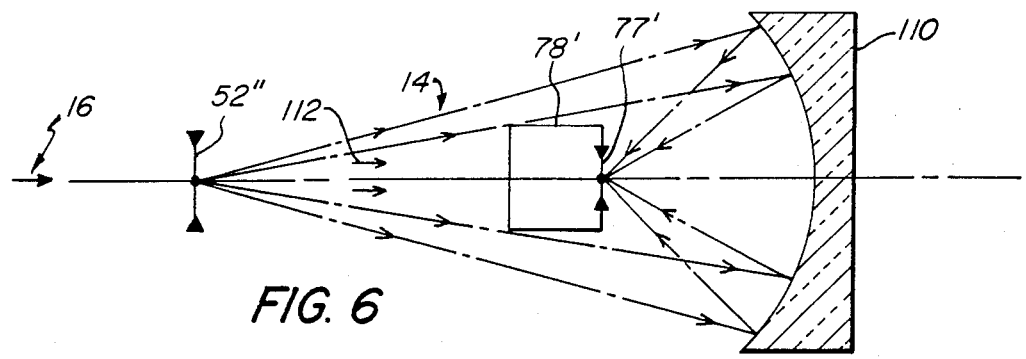
FIG. 6 is a sixth embodiment of the present invention illustrating an on-axis imaging system.

Another embodiment of the present invention is shown schematically in FIG. 6 which illustrates an on-axis imaging system. A UV beam is incident on a fluorescent plate 52''. The resulting fluorescent radiation 14 is incident on an image-forming mirror 110. The mirror reflects the fluorescence 14 onto the photosensitive surface 77' of a camera 78'. The UV radiation beams 112 are directly transmitted through the plate 52''. It should be noted that the central portion of the fluorescent beam 14 as well as the transmitted UV radiation is obscured by camera 78' and its mounting structure (not shown). The imaging forming mirror 110 could, if desired, be of an ellipsoidal contour to give a better quality image than a spherically contoured mirror, if desired.

Figure 7:
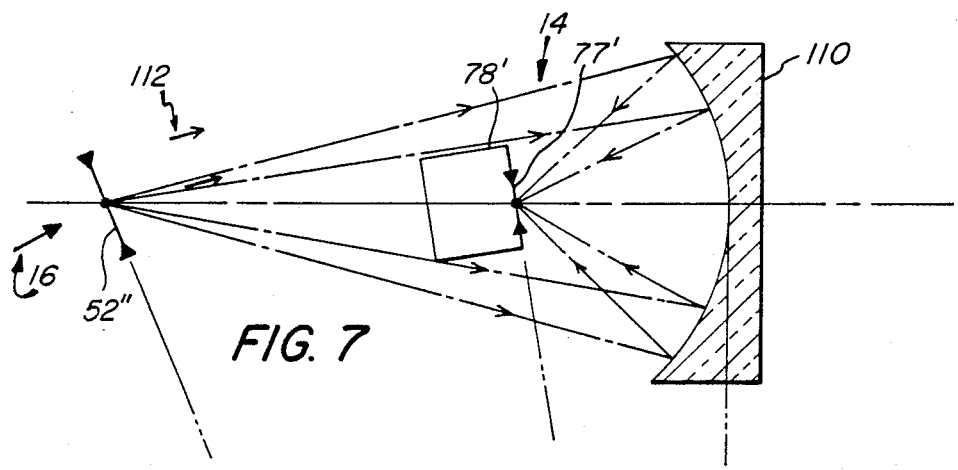
FIG. 7 is a seventh embodiment of the present invention illustrating a variation of the on-axis imaging system incorporating the Scheimpflug principle.

Referring to FIG. 7, there is shown a Scheimpflug variation of the embodiment illustrated in FIG. 6. In this case, the transmitted UV radiation 112 passes off at an angle and is not incident on the image-forming mirror 110. Again, the fluorescent beam 14 is partially obscured by the tilted camera 78'.

Figure 8:
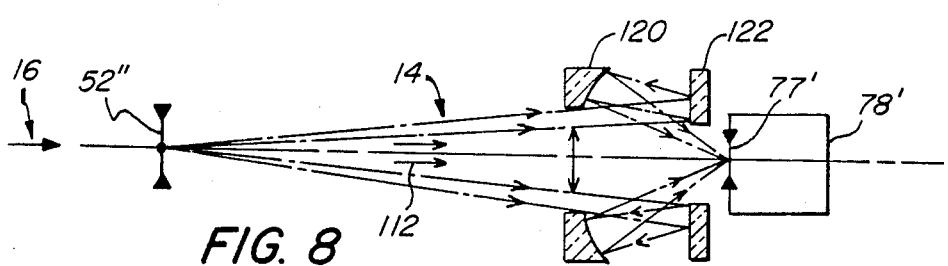
FIG. 8 is an eighth embodiment of the present invention incorporating mirrors to transmit an image to a camera.

FIG. 8 illustrates an embodiment providing an image-forming perforated mirror 120, typically having an ellipsoidal contour in conjunction with a folding flat perforated mirror 122 to allow the camera 78' to be positioned outside of the beam 14. Since the system illustrated in FIG. 8 functions on-axis, transmitted UV radiation can be incident on the photosensitive surface 77' of the camera 78'.

Figure 9:
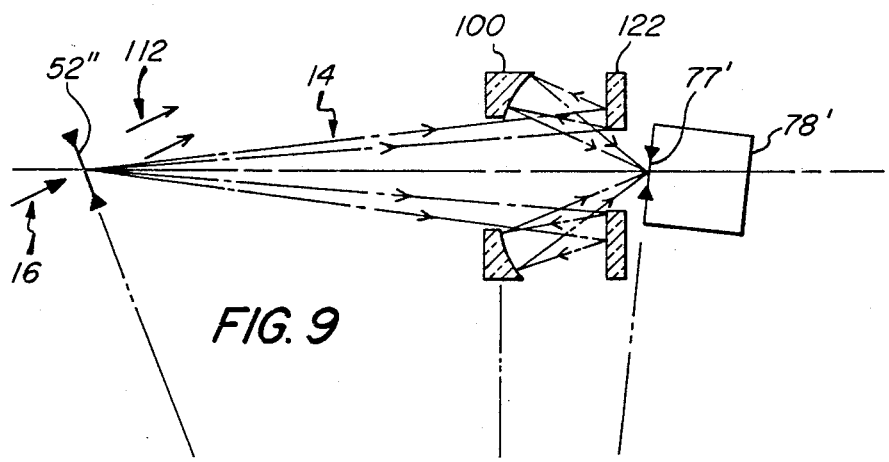
FIG. 9 is a ninth embodiment of the present invention illustrating a variation of the embodiment illustrated in FIG. 8 incorporating the Scheimpflug principle.

Referring to FIG. 9, there is illustrated a system of the type illustrated in FIG. 8 but incorporating the Scheimpflug principle. The advantage of the embodiment illustrated in FIG. 9, is that the directly transmitted UV radiation passes off at an angle and thereby does not impinge on the photosensitive surface 77' of camera 78'.

Although FIGS. 6 through 9 are provided with single image-forming mirrors, it would be within the terms of the present invention to construct each of these embodiments with a multiplicity of image-forming mirrors which would then operate using the same principles as known to one skilled in the art.

Although a high power UV-laser beam is measured by the instruments described hereinbefore, it is also within the terms of the present invention to use any desired UV beam.

The patent application, patents and articles set forth in this specification are intended to be incorporated by reference herein.

It is apparent that there has been provided in accordance with this invention a beam intensity profilometer and a method of using the profilometer which satisfies the objects, means and advantages set forth hereinbefore. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A beam intensity profilometer, comprising:
    means to produce a fluorescent emission distribution having a spatial distribution linearly proportional to the local intensity of an incident UV beam aimed on the emission distribution means, said means to produce the emission distribution comprising a plate constructed of fluorescent material optically transparent to fluorescent wavelengths; and
    means being operatively connected to the fluorescent emission distribution means for displaying and analyzing the spatial distribution of the UV beam as a function of the spatial distribution of the fluorescent emission.

2. The beam intensity profilometer of claim 1 wherein the fluorescent emission of said plate is linearly proportional to the incident UV radiation.

3. The beam intensity profilometer of claim 2 wherein said fluorescent material is selected from the group consisting essentially of rare earth doped crystals, rare earth doped glasses, undoped crystals and fluorescent mediums suspended in plastic.

4. The beam intensity profilometer of claim 3 wherein said rare earths are selected from the group consisting essentially of Ce, La, Eu, and Nd.

5. The beam intensity profilometer of claim 4 wherein said rear earth doped crystals comprise a $Ce^{3+}$: YAG.

6. The beam intensity profilometer of claim 3 wherein said displaying and analyzing means comprises a camera system.

7. The beam intensity profilometer of claim 6 further including means between said camera system and said plate for reimaging the fluorescent emission distribution from the plate onto a photosensitive surface of the camera system.

8. The beam intensity profilometer of claim 7 wherein said reimaging means is selected from the group consisting essentially of a single lens, a group of multiple lenses, multiple lenses, a multiplicity of groups of lenses, a mirrior and plurality of mirrors.

9. The beam intensity profilometer of claim 7 further including a computer connected to said camera system.

10. The beam intensity profilometer of claim 6 wherein said fluorescent material is affixed to the face plate of said camera system.

11. The beam intensity profilometer of claim 10 wherein said face plate is a fiber optic face plate.

12. The beam intensity profilometer of claim 11 wherein the means to display and analyze the power and energy includes a photodetector.

13. The beam intensity profilometer of claim 12 further including
- a substantially light tight enclosure containing a plate constructed of a material which produces fluorescence in response to an incident UV beam; and
- a detector to convert emitted fluorescence from the plate to an optical signal for measuring the energy and power of the UV beam.

14. The beam intensity profilometer of claim 7 wherein said plate is joined to the face plate of the camera system.

15. The beam intensity profilometer of claim 14 further including UV filter coatings between said face plate and said plate.

16. The beam intensity profilometer of claim 13 further including a UV wave trap within the enclosure.

17. The method of determining the intensity of a UV beam, comprising the steps of:
produced a fluorescent emission having a spatial distribution proportional to the local intensity of an incident UV beam;
displaying and analyzing the UV beam as a function of the fluorescent emission distribution; and
measuring and displaying the power and energy of the UV beam.

* * * * *